United States Patent
Kim (10) Patent No.: US 8,338,832 B2
(45) Date of Patent: Dec. 25, 2012

(54) ORGANIC LIGHT EMITTING DISPLAY DEVICE

(75) Inventor: Eun Ah Kim, Suwon (KR)

(73) Assignee: Samsung Display Co., Ltd., Yongin-si (KR)

( * ) Notice: Subject to any disclaimer, the term of this patent is extended or adjusted under 35 U.S.C. 154(b) by 1275 days.

(21) Appl. No.: 11/599,670

(22) Filed: Nov. 14, 2006

(65) Prior Publication Data
US 2007/0108443 A1    May 17, 2007

(30) Foreign Application Priority Data

Nov. 14, 2005 (KR) .................. 10-2005-0108795

(51) Int. Cl.
*H01L 27/14* (2006.01)
(52) U.S. Cl. ............ 257/72; 257/59; 345/695
(58) Field of Classification Search ............ 257/57, 257/59, 66, 72, E27.12–E27.121, 40, E27.117–E27.119, 257/E29.276; 345/694–695, 80; 313/504
See application file for complete search history.

(56) References Cited

U.S. PATENT DOCUMENTS

| | | | | |
|---|---|---|---|---|
| 6,225,750 B1 * | 5/2001 | Kimura | ...................... | 315/169.3 |
| 6,501,448 B1 * | 12/2002 | Komiya et al. | .................. | 345/80 |
| 6,690,697 B1 * | 2/2004 | Kahen | ............................ | 372/39 |
| 6,791,129 B2 | 9/2004 | Inukai | | |
| 2002/0070381 A1 * | 6/2002 | Yamada et al. | .................. | 257/59 |
| 2002/0084746 A1 * | 7/2002 | Anzai | ............................ | 313/504 |
| 2004/0065902 A1 * | 4/2004 | Yamazaki et al. | ............. | 257/200 |
| 2004/0173819 A1 * | 9/2004 | Matsumoto | ................... | 257/200 |
| 2004/0239658 A1 * | 12/2004 | Koyama et al. | ................ | 345/204 |
| 2004/0246209 A1 | 12/2004 | Sung | | |
| 2004/0252085 A1 * | 12/2004 | Miyagawa | ...................... | 345/76 |
| 2004/0263499 A1 | 12/2004 | Tanada et al. | | |
| 2005/0012694 A1 | 1/2005 | Park et al. | | |
| 2005/0057177 A1 | 3/2005 | Lu et al. | | |
| 2005/0161665 A1 * | 7/2005 | Winters et al. | .................. | 257/40 |

(Continued)

FOREIGN PATENT DOCUMENTS

| | | |
|---|---|---|
| KR | 2002-0025842 | 4/2002 |
| KR | 10-2005-0050001 | 5/2005 |
| WO | WO 2005101513 A1 * | 10/2005 |

OTHER PUBLICATIONS

Sedra, A.S. and Smith, K.C. Microelectronics Circuits. 4th Ed. Oxford University Press: New York (1998): pp. 1061.*

(Continued)

*Primary Examiner* — Jenny L Wagner
*Assistant Examiner* — Mark Tornow
(74) *Attorney, Agent, or Firm* — Christie, Parker & Hale, LLP (57) ABSTRACT

An organic light emitting display device, which may maximize aperture ratio of a pixel while also reducing the perception of a dark spot when a sub-pixel is partially short-circuited. The organic light emitting display device includes a plurality of pixels having sub-pixels. Some of the sub-pixels may have a thin organic emission layer which makes them likely to short-circuit across the thin organic emission layer. These sub-pixels are formed as divided sub-pixels including at least two drive transistors and operate such that even if one part of the divided sub-pixel has a short circuit, the other part will continue to emit light. Accordingly, while luminance is reduced as a result of short circuiting, a completely dark spot will not appear in the place of the pixel including the short circuit.

23 Claims, 9 Drawing Sheets

U.S. PATENT DOCUMENTS

| | | | |
|---|---|---|---|
| 2005/0186330 A1* | 8/2005 | Kim et al. | 427/66 |
| 2005/0285508 A1* | 12/2005 | Murayama et al. | 313/503 |
| 2006/0028495 A1* | 2/2006 | Phan | 345/694 |
| 2006/0061525 A1* | 3/2006 | Kim et al. | 345/76 |
| 2006/0170712 A1* | 8/2006 | Miller et al. | 345/695 |
| 2007/0216610 A1* | 9/2007 | Smith | 345/76 |
| 2007/0222800 A1* | 9/2007 | Fish et al. | 345/694 |

OTHER PUBLICATIONS

Korean Patent Abstracts, Publication No. 1020050050001 A, dated May 27, 2005, in the name of Eun Ah Kim et al.

U.S. Office action dated Apr. 28, 2009, for related U.S. Appl. No. 11/217,596, noting listed reference in this IDS.

Korean Patent Abstracts, Publication No. 1020020025842 A, dated Apr. 4, 2002, in the name of Katsuya Anzai et al.

U.S. Office action dated Oct. 29, 2008, for related U.S. Appl. No. 11/217,596, indicating relevance of listed U.S. references in this IDS.

U.S. Office action dated Aug. 31, 2009, for related U.S. Appl. No. 11/217,596, noting listed U.S Publication 2005/0057177 in this IDS.

U.S. Office action dated Mar. 1, 2010, for related U.S. Appl. No. 11/217,596, noting listed U.S. Patent 6,225,750 in this IDS.

Non-Final Office action issued for U.S. Appl. No. 11/217,596, date of mailing Nov. 15, 2010, 17 pages.

* cited by examiner

ORGANIC LIGHT EMITTING DISPLAY DEVICE

CROSS-REFERENCE TO RELATED APPLICATIONS

This application claims priority to and the benefit of Korean Patent Application No. 10-2005-0108795, filed on Nov. 14, 2005, in the Korean Intellectual Property Office, the entire content of which is incorporated herein by reference.

BACKGROUND

1. Field of the Invention

The present invention relates to an organic light emitting display device, and more particularly to an organic light emitting display device decreasing the perception of a dark pixel occurring due to a short-circuit between a first electrode and a second electrode of an organic light emitting diode.

2. Discussion of Related Art

Organic light emitting display devices are spontaneous emission devices that emit light by re-combination of electrons supplied from a cathode and holes supplied from an anode. An electroluminescent (EL) display using the organic light emitting display device does not require additional back light, has a wider angle of visibility, higher response speed compared with a passive EL device, a lower direct current drive voltage, and can be formed in a ultra-thin pattern. Therefore, it may be implemented in a wall hanging type of display or a portable display.

The organic light emitting display device is driven either by a passive matrix method or by an active matrix method using a thin film transistor. In a display driven according to the passive matrix method, an anode and a cathode are formed to intersect, and a line is selected to be driven. In a display driven according to the active matrix method, a thin film transistor is connected to each anode electrode (indium tin oxide (ITO)) and is driven by a voltage maintained by a capacitor, which is connected to a gate of the thin film transistor.

Figure 1:
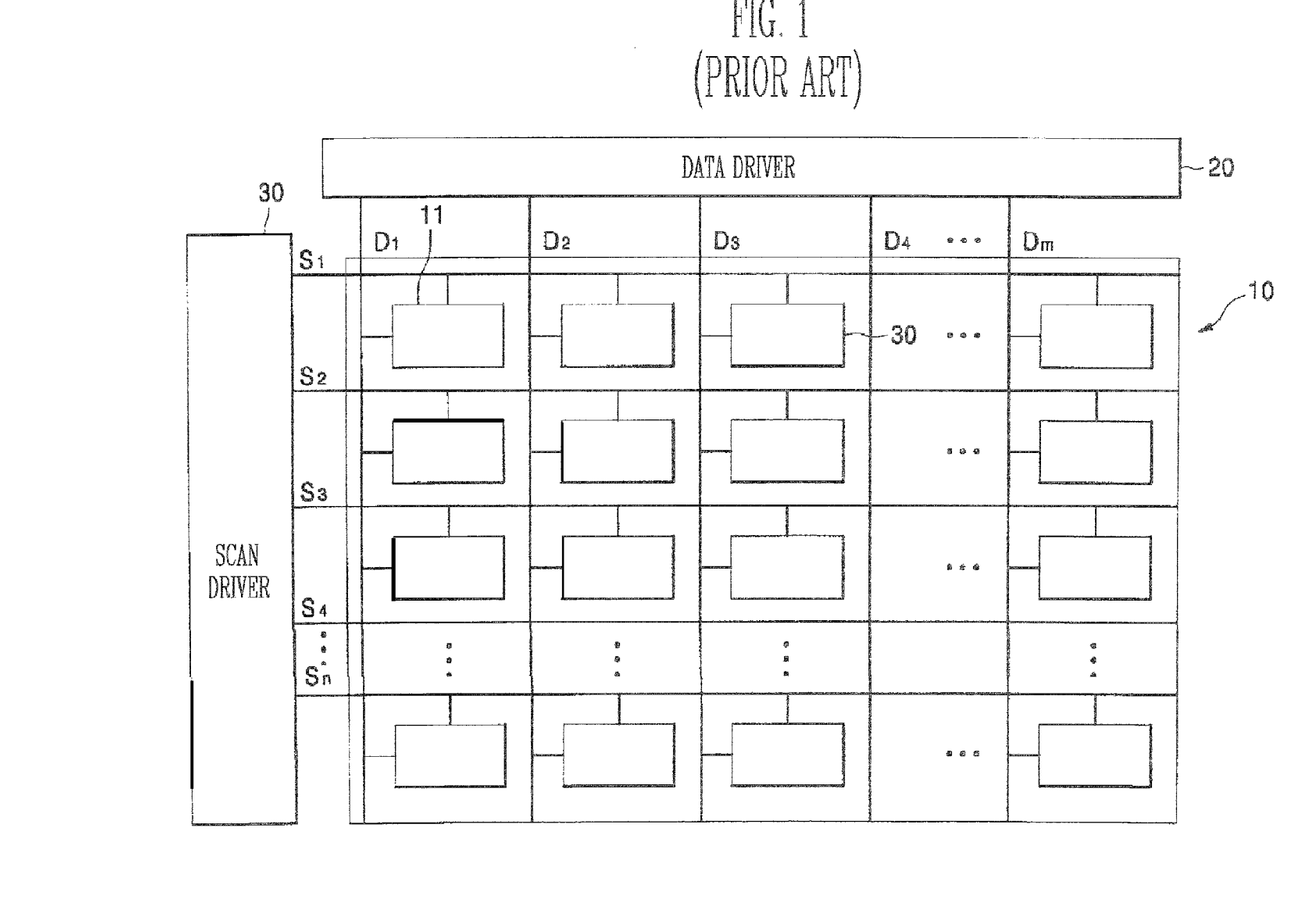
FIG. 1 is a block diagram showing a conventional organic light emitting display device.

FIG. 1 is a block diagram showing a conventional organic light emitting display device. The conventional organic light emitting display device includes a display region 10, a data driver 20, and a scan driver 30.

The display region 10 includes a plurality of data lines D1, D2, D3 ... Dm, and a plurality of scan lines S1, S2, S3 ... Sn, arranged to cross directions, and a plurality of pixels 11. The data lines D1, D2, D3 ... Dm carry a data signal, and the scan lines S1, S2, S3 ... Sn carry a scan signal. The pixels 11 are formed at intersections of the data lines D1, D2, D3 ... Dm and the scan lines S1, S2, S3 ... Sn.

The data driver 20 outputs a data signal indicating an image signal through the data lines D1, D2, D3 ... Dm. The scan driver 30 sequentially outputs a select signal through the scan lines S1, S2, S3 ... Sn to drive the pixel 11. The pixel 11 may include sub-pixels.

Figure 2:
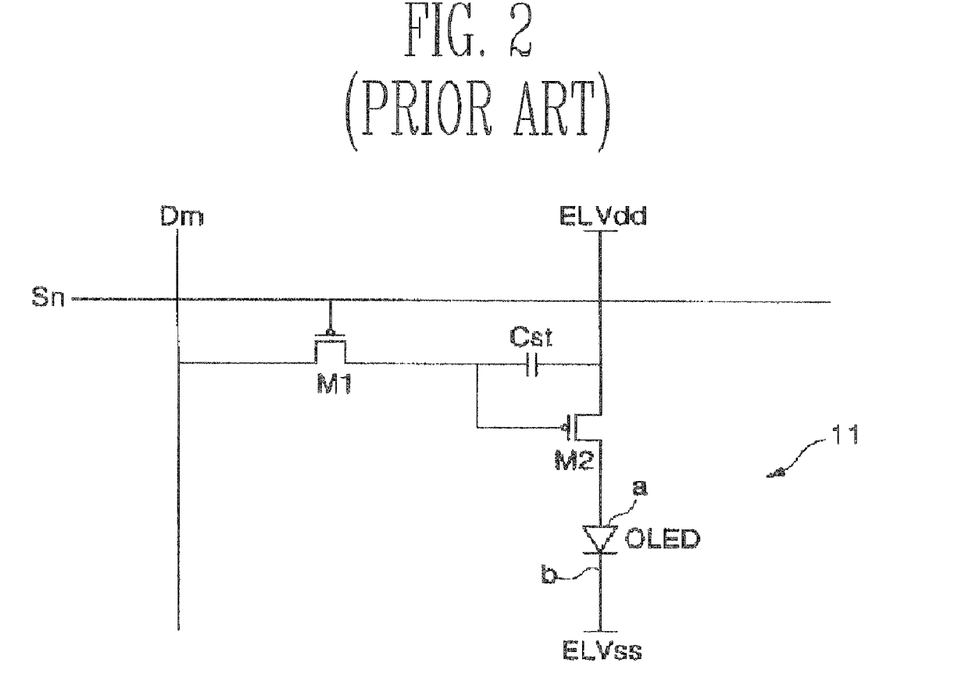
FIG. 2 is a circuit diagram showing a pixel of the conventional organic light emitting display device.

FIG. 2 is a circuit diagram showing one unit pixel of the conventional organic light emitting display device, and shows a representative pixel among n×m pixels of the display region in the organic light emitting display device shown in FIG. 1.

As shown in FIG. 2, the circuit of pixel 11 includes an organic light emitting diode OLED, a switching transistor M1, a drive transistor M2, a capacitor Cst, a scan line Sn, and a data line Dm. When the pixel 11 includes sub-pixels, each sub-pixel would include a similar circuit.

A gate of the switching transistor M1 is connected to the scan line Sn, and a source thereof is connected to the data line Dm. The switching transistor M1 transfers a data signal from the data line Dm to a gate of the drive transistor M2 in response to a select signal from the scan line Sn. A source of the drive transistor M2 is connected to a power source voltage ELVDD, and a capacitor Cst is connected between a gate and the source of the drive transistor M2. The capacitor Cst maintains the gate-source voltage $V_{gs}$ of the drive transistor M2 during a predetermined time period.

A cathode b of the organic light emitting diode OLED is connected to a reference voltage ELVSS. The organic light emitting diode OLED emits light according to an electric current applied through the drive transistor M2. The reference voltage ELVSS connected to the cathode b of the organic light emitting diode OLED is less than the power source voltage ELVDD, and a ground voltage can be used as the reference voltage ELVSS.

The electric current flowing through the organic light emitting diode OLED is expressed by a following equation 1:

$$I_{OLED} = \frac{\beta}{2}(V_{gs} - V_{th})^2 = \frac{\beta}{2}(V_{DD} - V_{data} - |V_{th}|)^2 \quad (1)$$

where, $I_{OLED}$ is the electric current flowing through the organic light emitting diode OLED, $V_{gs}$ is a voltage between a gate and a source of the drive transistor M2, $V_{th}$ is a threshold voltage of the drive transistor M2, $V_{data}$ is a data voltage, and $\beta$ is a constant.

As indicated in the equation 1, according to the pixel circuit shown in FIG. 2, an electric current corresponding to applied data voltage $V_{data}$ is supplied to the organic light emitting diode OLED, so that the organic light emitting diode OLED emits light corresponding to the applied data voltage $V_{data}$.

Figure 3:
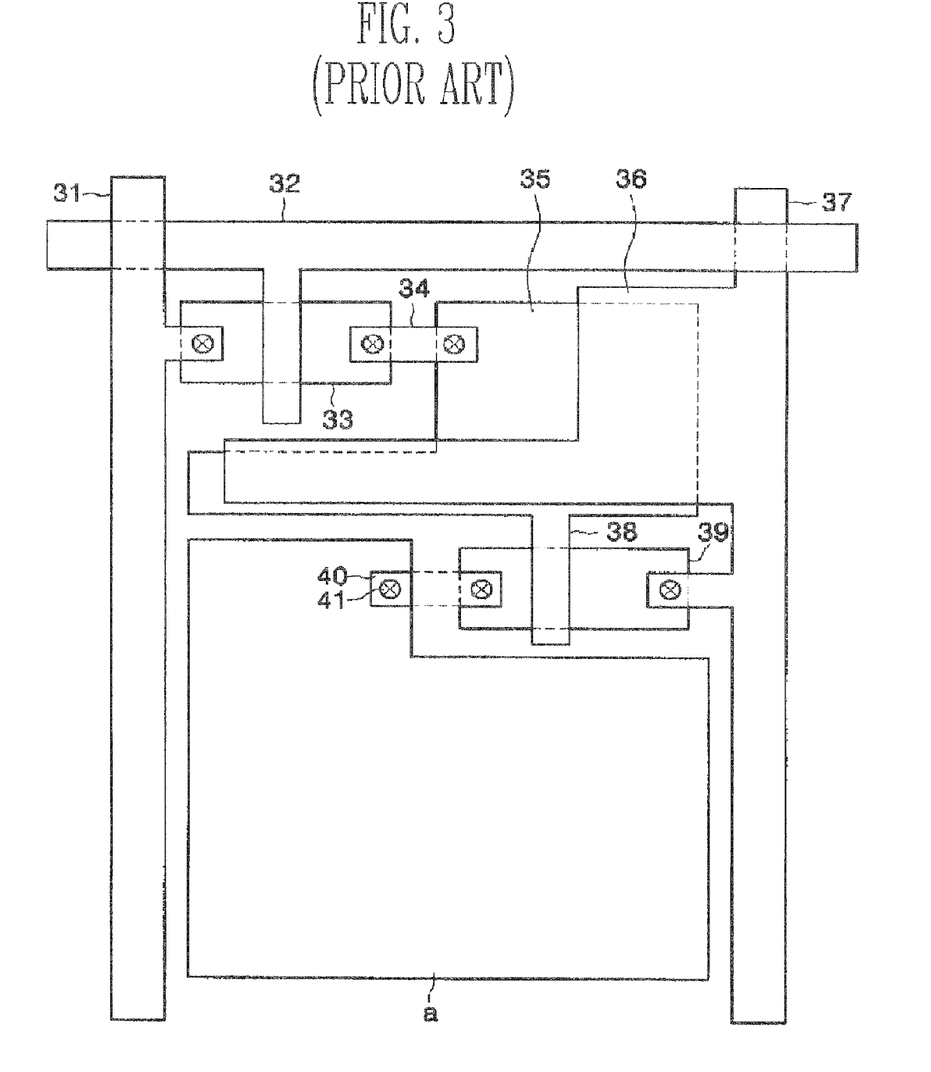
FIG. 3 is a plan view showing a pixel of the conventional organic light emitting display device.

FIG. 3 is a plan view showing one unit pixel of the conventional organic light emitting display device. This plan view may also correspond to a sub-pixel within a pixel.

The conventional unit pixel includes a scan line 32 arranged along one direction, a data line 31 arranged along a direction intersecting the direction of the scan line 32, and a power supply line 37 arranged parallel with the data line 31 to intersect the scan line 32. Furthermore, the switching transistor 33 is connected to the scan line 32 and the data line 31, respectively. A capacitor includes a lower electrode 35 and an upper electrode 36. The lower electrode 35 is connected to one of source/drain electrodes 34 of the switching transistor 33 through a contact hole. The upper electrode 36 is connected to the power supply line 37 and is arranged at an upper side of the lower electrode 35 of the capacitor. A gate 38 of the drive transistor 39 is connected to the lower electrode 35 of the capacitor. The drive transistor 39 includes a source/drain electrode 40 that is connected to an anode electrode a through a via 41.

In the conventional unit pixel, the organic light emitting diode OLED includes the anode electrode a, an organic emission layer, and a cathode electrode b. The anode electrode a is formed on a substrate. The organic emission layer is formed over an upper surface of the anode electrode a. The cathode electrode b is formed over an upper surface of the organic emission layer. The cathode electrode b and the organic emission layer are not shown in FIG. 3.

Furthermore, only the organic emission layer (shown in FIG. 4) exists between the anode electrode a and the cathode electrode b. An insulation film exists around the anode electrode. This prevents the anode electrode a and the cathode electrode b from electrically conducting to each other without the current first passing through the organic emission layer.

However, in the conventional organic light emitting diode OLED, one anode electrode and one cathode electrode are arranged in one unit pixel. During the manufacturing process, minute dust is interposed between the anode electrode and the cathode electrode. Due to patterning flaws and external pressure, the anode electrode and the cathode electrode that are to be insulated from each other, may contact and conduct, thereby causing a short. This is shown in FIG. 4.

Figure 4:
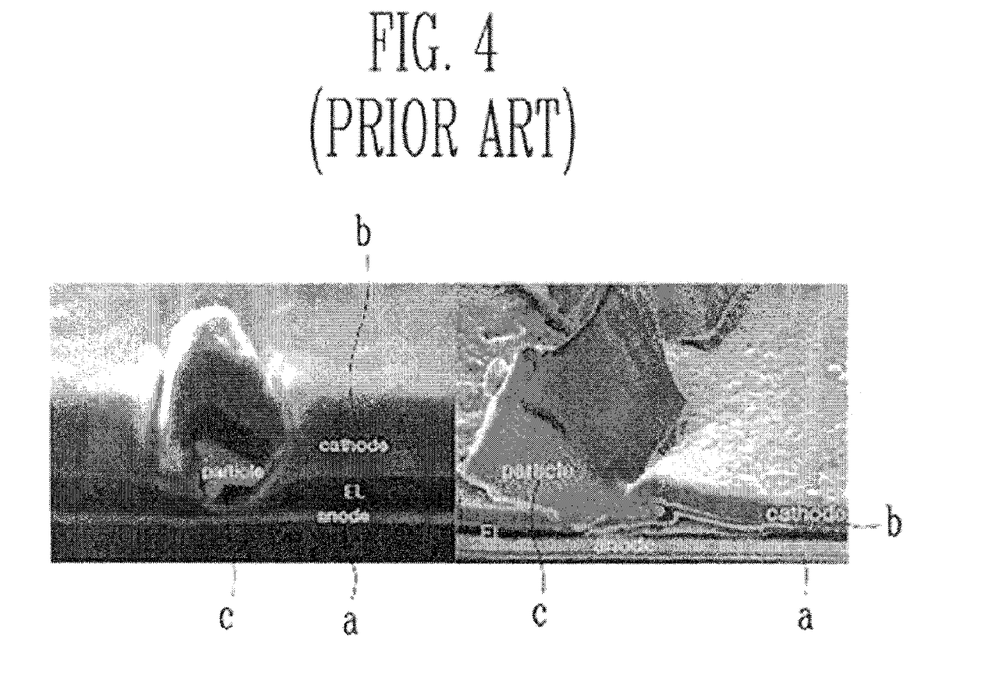
FIG. 4 is a cross-sectional view showing a short-circuit between an anode electrode and a cathode electrode of an organic light emitting diode included in the conventional organic light emitting display device.

FIG. 4 is a cross-sectional view showing a short-circuit between an anode electrode and a cathode electrode of a conventional organic light emitting display device. Reference numeral a represents the anode electrode, reference numeral b represents the cathode electrode, and reference numeral c represents minute dust.

As shown in FIG. 4, because the minute dust c penetrates the insulation film between the anode electrode a and the cathode electrode b, the anode electrode a and the cathode electrode b are short-circuited. Due to the short-circuit between the anode electrode a and the cathode electrode b, a cathode voltage ELVSS is applied to the anode electrode a. Accordingly, the drain current of the drive transistor, that corresponds to the data signal, flows into the shorted cathode electrode b instead of into the organic emission layer, thereby not emitting the intended color. This causes a dark pixel to be displayed and deteriorates the image.

Typically, a unit pixel includes a plurality of sub-pixels. Each of the sub-pixels includes an organic film having a different material and thickness according to a color to be embodied. Many dark pixels due to a short-circuit between the anode electrode a and the cathode electrode b may occur at a sub-pixel formed by a thin organic emission layer. According to experimental results, the occurrence rate of a progressive dark pixel in a blue sub-pixel is more than 10 times other colors. An improved scheme is therefore desirable.

SUMMARY OF THE INVENTION

Accordingly, embodiments of the present invention provide an organic light emitting display device which may maximize aperture ratio of a pixel while reducing the perception of the deterioration of a pixel when a sub-pixel of the pixel is short-circuited.

Embodiments of the invention include an organic light emitting display device including a plurality of pixels, each pixel having at least two sub-pixel, wherein a sub-pixel having a thinner organic emission layer compared to other sub-pixels includes at least two drive transistors.

One embodiment of the present invention provides an organic light emitting display device including a plurality of pixels formed where a plurality of scan lines and a plurality of data lines cross over one another or where the directions of the scan lines intersect the directions of the data lines. Each pixel includes at least one divided sub-pixel. The divided sub-pixel includes at least two drive transistors being electrically connected to each other to receive the same gate to source voltage. A data signal is transferred through the data lines to the drive transistors. The sub-pixel also includes an organic light emitting diode having first electrodes receiving an electric current corresponding to the drive transistors, organic emission layers being formed over the first electrodes, and second electrode being formed over the organic emission layers. When the pixel includes several sub-pixels, a sub-pixel having a thinner organic emission layer is formed as the divided sub-pixel.

According to one aspect of the present invention, there is provided an organic light emitting display device including a plurality of pixel formed at intersections of directions of a plurality of scan lines and directions of a plurality of data lines, each unit pixel including at least one divided sub-pixel. A sub-pixel having an organic emission layer the thickness of which is thinner than any other sub-pixel includes is formed as a divided sub-pixel. The divided sub-pixel includes a switching transistor having a gate connected to the scan lines and a source connected to the data lines, a capacitor having a lower electrode connected to a drain of the switching transistor and an upper electrode connected to a power source, at least two drive transistors connected to each other to share the same gate to source voltage, a source of each drive transistor being connected to the power source and a drain of each being connected to the drain of the switching transistor, and an organic light emitting diode including first electrodes receiving an electric current corresponding to the drive transistors, organic emission layers being formed over the first electrodes, and second electrode being formed over the organic emission layers.

According to one aspect of the present invention, there is provided an organic light emitting display device including a plurality of pixel formed at intersections of directions of a plurality of scan lines and directions of a plurality of data lines, each unit pixel including at least one divided sub-pixel. A sub-pixel having an organic emission layer the thickness of which is thinner than any other sub-pixel is formed as a divided sub-pixel and includes a switching transistor having a gate connected to the scan lines and a source connected to the data lines, a capacitor having a first electrode connected to a drain of the switching transistor and a second electrode connected to a power source, at least two drive transistors connected to each other to share the same gate to source voltage, sources of both of the drive transistors being commonly connected to the power source and a gate of each drive transistor being connected to the drain of the switching transistor, and an organic light emitting diode including first electrodes receiving an electric current corresponding to the drive transistors, organic emission layers being formed at the first electrodes, and a second electrode being formed on the organic emission layers.

The organic light emitting display device according to the embodiments of the present invention includes a drive transistor and an organic light emitting diode having first electrodes and a second common electrode, which are formed at a sub-pixel of a pixel having an organic emission layer the thickness of which is thinner than any other sub-pixels. Accordingly, even when a short between one of the first electrodes and the second electrode occurs, organic light emitting diodes corresponding to the remaining first electrode emit light. As a result, it becomes difficult to visually recognize the deterioration of the unit pixel due to the occurrence of a dark pixel.

In addition, the organic light emitting display device of the present invention can prevent a reduction in an aperture ratio in comparison with a case of having drive transistors, a first electrode, and an organic emission layer, which are formed at every one of the sub-pixels.

DETAILED DESCRIPTION

Figure 5A:
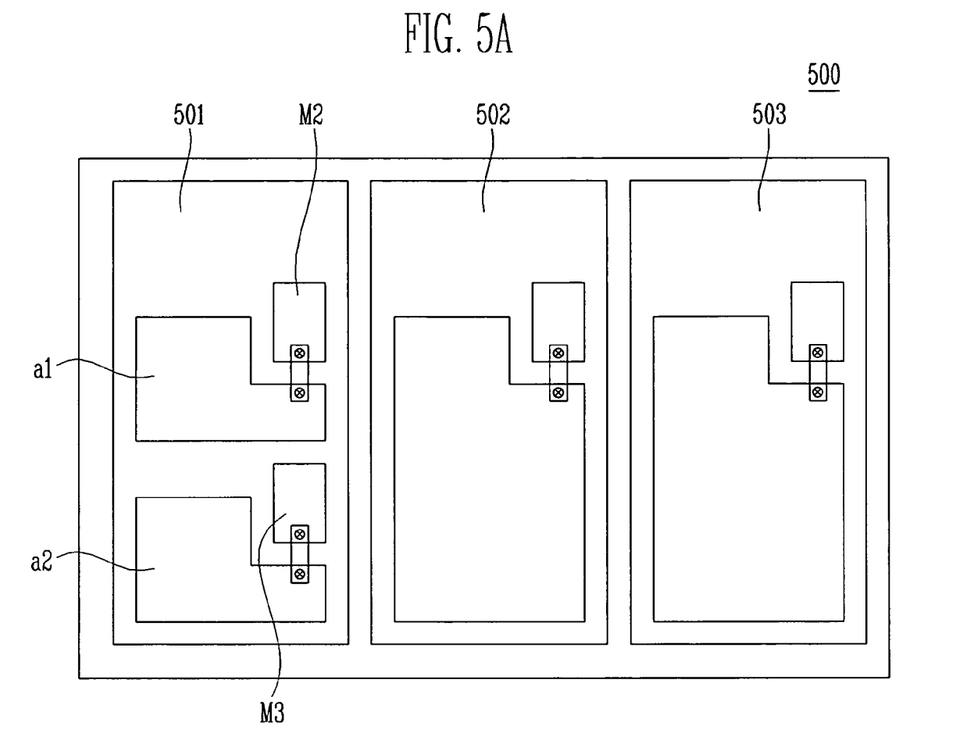
FIG. 5A is plan view of a pixel according to an embodiment of the present invention.

FIG. 5A is a plan view of a unit pixel 500 according to an embodiment of the present invention. The unit pixel 500 is shown to include three sub-pixels 501, 502, 503. A first sub-pixel 501 has an organic emission layer whose thickness is thinner than that of any other sub-pixel. The first sub-pixel 501 includes two drive transistors M2, M3, and two first electrodes a1 and a2. The first sub-pixel 501 is, therefore, a divided sub-pixel. Each of other sub-pixels 502, 503 includes one drive transistor and a first electrode.

Figure 5B:
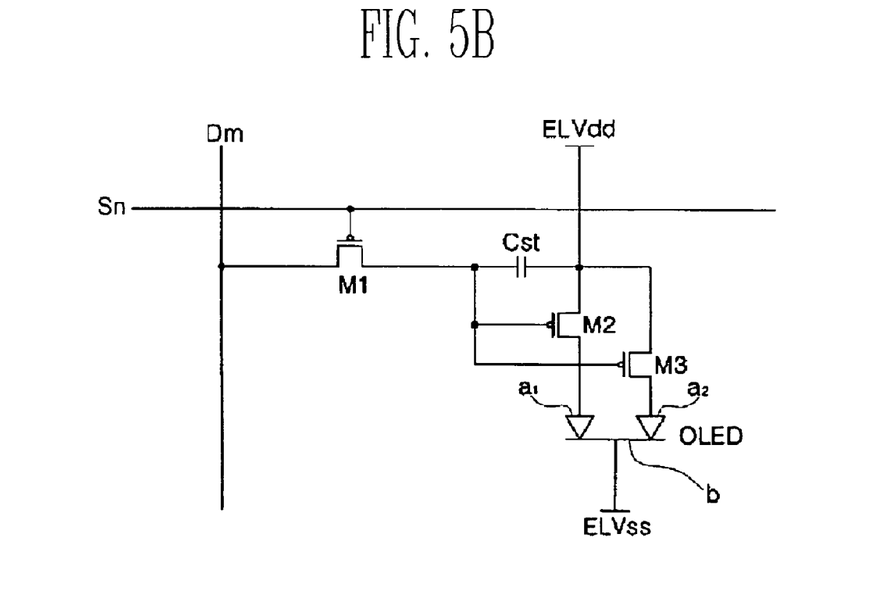
FIG. 5B is a circuit diagram of a divided sub-pixel having a thin organic emission layer according to an embodiment of the present invention.

FIG. 5B is a circuit diagram showing a sub-pixel having a thin organic emission layer according to an embodiment of the present invention. The sub-pixel shown is a divided sub-pixel included in a representative pixel among n×m pixels, and is connected to a data line Dm and a scan line Sn.

The circuit for the divided sub-pixel includes a switching transistor M1, a first drive transistor M2, a second drive transistor M3, a capacitor Cst, and an organic light emitting diode OLED having two anode electrodes a1, a2. The organic light emitting diode OLED also has a cathode electrode b corresponding to both anode electrodes a1, a2. In the exemplary embodiment shown, the first drive transistor M2 and the second drive transistor M3 are PMOS transistors.

A gate of the switching transistor M1 is connected to the scan line Sn. The switching transistor M1 transfers a data voltage from the data line Dm connected to a source of the switching transistor M1 to gates of the first and second drive transistors M2, M3 in response to a select signal from the scan line Sn.

A source of the first drive transistor M2 is connected to a power source of voltage ELVDD, the gate thereof is connected to a drain of the switching transistor M1, and a drain of the first drive transistor is connected to the first anode electrode a1 of the organic light emitting diode OLED.

A source of the second drive transistor M3 is connected to the power source of voltage ELVDD, the gate thereof is connected to the drain of the switching transistor M1, and a drain of the second drive transistor M3 is connected to the second anode electrode a2 of the organic light emitting diode OLED.

That is, the sources of the first and second drive transistors M2, M3 are connected in common and the gates of these two transistors are also connected together.

The capacitor Cst is connected between the common node between the gates and the common node between the sources of the first and second drive transistors M2, M3. The capacitor Cst maintains a gate-source voltage Vgs during a predetermined time period.

Cathode electrodes of the organic light emitting diode OLED are connected to a reference voltage ELVSS in common. The first and second anode electrodes a1, a2 of the organic light emitting diode OLED are connected to the drains of the first and second drive transistors M2, M3, respectively. The organic light emitting diode OLED emits light corresponding to a current from the first and second drive transistors M2, M3.

When a select signal is applied to the gate of the switching transistor M1, the switching transistor M1 is turned on to transfer and store the data signal from the data line Dm to and in the capacitor Cst. Next, the data signal stored in the capacitor Cst is transferred to the first and second drive transistors M2, M3. Accordingly, the first drive transistor M2 and the second drive transistor M3 provide a drive current expressed by the equation 1 corresponding to the applied data signal to the organic light emitting diode OLED through the first and second anode electrodes a1, a2, respectively. The organic light emitting diode OLED emits light according to the drive currents received from the first and second drive transistors M2, M3.

On the other hand, due to fabrication problems arising from external pressure or minute dust, one or both of the anode electrodes may be shorted to the cathode electrode b resulting in a defective pixel. If, for example, the second anode electrode a2, and the cathode electrode b are shorted, the drive current flowing through the second drive transistor M3 connected to the second anode electrode a2 shorts directly into the cathode electrode b, so the organic light emitting diode corresponding to the second anode electrode a2 does not emit light.

However, a normal current flows through the organic light emitting diode corresponding to the first anode electrode a1, causing this organic light emitting diode to emit light. In this case, the emission luminance is smaller because only one of the two diodes is emitting.

However, since embodiments of the present invention do not result in a completely dark pixel, it becomes difficult to visually recognize the deterioration of the pixel.

Although the first and second drive transistors M2, M3 are shown as PMOS transistors in FIGS. 5A and 5B, they can also be NMOS transistors.

Figure 6:
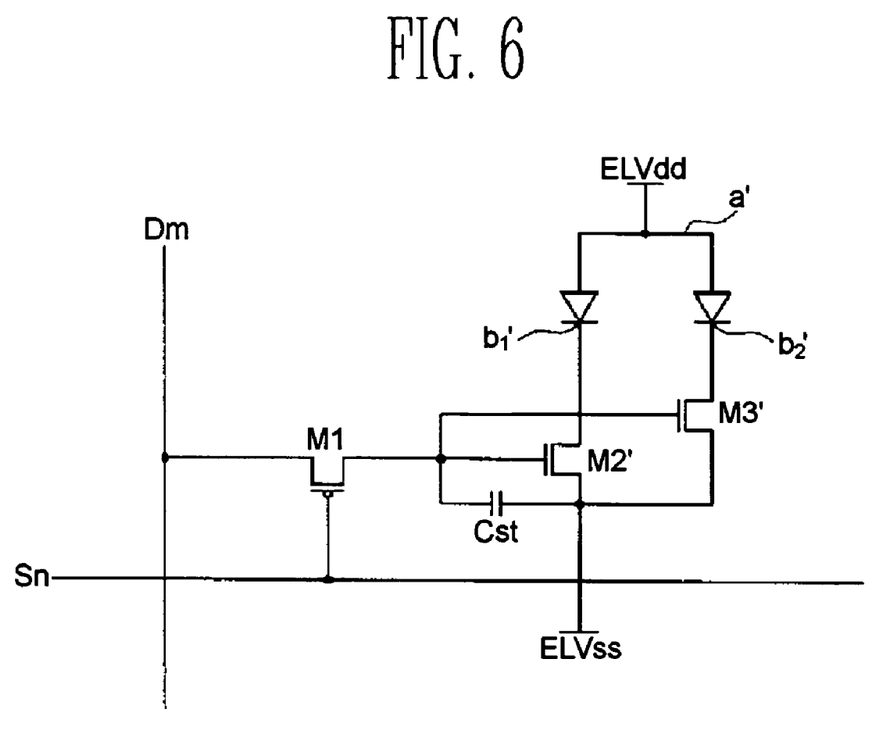
FIG. 6 is a circuit diagram of a divided sub-pixel including NMOS-type drive transistors according to an embodiment of the present invention.

FIG. 6 is a circuit for a divided sub-pixel including NMOS-type drive transistors according to one embodiment of the present invention.

The circuit of FIG. 6 includes a switching transistor M1, a first drive transistor M2', a second drive transistor M3', a capacitor Cst, and an organic light emitting diode OLED having two cathode electrodes b1', b2' and a common anode electrode a'. The first drive transistor M2' and the second drive transistor M3' are NMOS transistors.

A gate of the switching transistor M1 is connected to a scan line Sn. The switching transistor M1 transfers a data voltage from the data line Dm connected to a source of the switching transistor M1 to gates of the first and second drive transistors M2' and M3' in response to a select signal from the scan line Sn.

A source of the first drive transistor M2' is connected to a power source of voltage ELVSS, the gate of it is connected to a drain of the switching transistor M1, and a drain of the first drive transistor M2' is connected to the first cathode electrode b1' of the organic light emitting diode OLED.

A source of the second drive transistor M3' is connected to a power source of voltage ELVSS, a gate thereof is connected to a drain of the switching transistor M1, and a drain of the second drive transistor M3' is connected to the second cathode electrode b2' of the organic light emitting diode OLED.

That is, the sources of the first and second drive transistors M2' and M3' are connected together forming a common node and the gates of these two transistors are also connected together forming another common node.

The capacitor Cst is connected between the common node connecting the gates of the first and second transistors M2' and M3' and the common node connecting the source of these two transistors. The capacitor Cst maintains a gate-source voltage Vgs for these two transistors during a predetermined time period.

Anode electrodes of the organic light emitting diode OLED are both connected to a power source of voltage ELVDD. The commonly connected anode electrodes are shown as the common anode electrode a'. The first and second cathode electrodes b1' and b2' of the two organic light emitting diodes OLED are respectively connected to the drains of the first and second drive transistors M2' and M3'.

Since the driving operation of the sub-pixel circuit of FIG. 6 can be understood by those skilled in the art based on the driving operation of the sub-pixel circuit of FIGS. 5A and 5B, a detailed description of the operation of the circuit of FIG. 6 is omitted. Further, a plan view and a cross-sectional view of a divided sub-pixel circuit will be explained based on a circuit using PMOS transistors.

Figure 7:
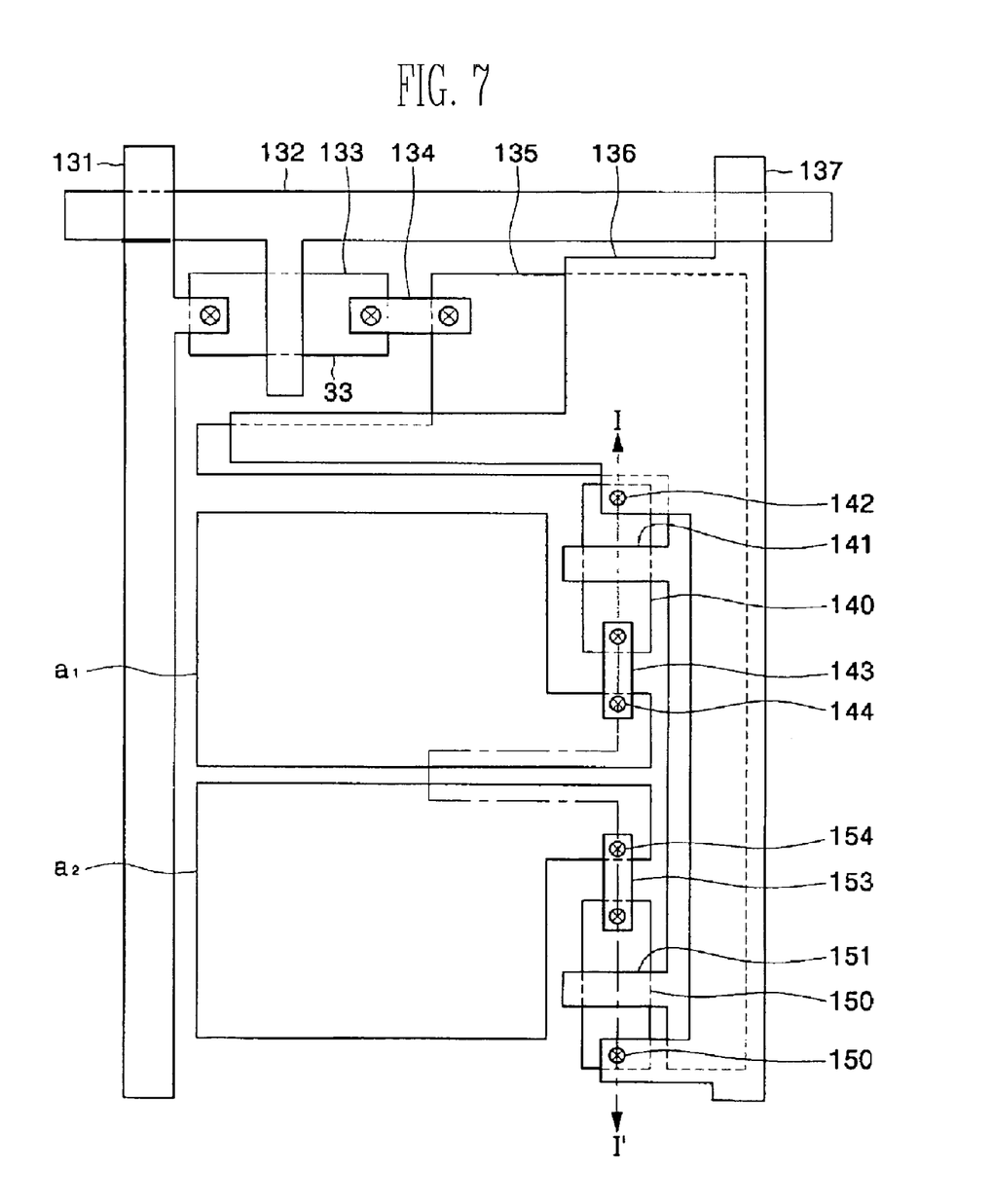
FIG. 7 is a plan view of a divided sub-pixel of an organic light emitting display device according to an embodiment of the present invention.

FIG. 7 is a plan view of a divided sub-pixel of an organic light emitting display device according to an embodiment of the present invention. This sub-pixel may be included in a pixel.

The sub-pixel of FIG. 7 includes a scan line 132 arranged in one direction, a data line 131 arranged along an intersecting direction of the scan line 132, and a power supply line 137 arranged parallel with the data line 131 to intersect the scan line 132.

Furthermore, the switching transistor 133 is connected to the scan line 132 and the data line 131. A capacitor includes a lower electrode 135 and an upper electrode 136. The lower electrode 135 is connected to one of source/drain electrodes 134 of the switching transistor 133 through a contact hole. The upper electrode 136 is connected to the power supply line 137. In the plan view shown, the upper electrode 136 is located over the lower electrode 135 of the capacitor.

A gate 141 of the first drive transistor 140 is connected to the lower electrode 135 of the capacitor, and a source of this transistor is connected to the power supply line 137. A gate 151 of the second drive transistor 150 is connected to the lower electrode 135 of the capacitor, and a source thereof is connected to the power supply line 137.

The organic light emitting diode OLED includes an anode electrode, which is divided into first and second anode electrodes a1, a2. An organic emission layer is formed over the first and second anode electrodes a1, a2, and a common cathode electrode is formed over the organic emission layer. The first anode electrode a1 is connected to one of the source or drain electrodes of the first drive transistor 140 through a via. In the exemplary embodiment shown, the first anode electrode a1 is connected to the drain 143 of the first drive transistor 140 through the via 144. The second anode electrode a2 is connected to one of the source or drain electrodes of the second drive transistor through a via. In the exemplary embodiment shown, the second anode electrode a2 is connected to the drain 153 of the second drive transistor 150 through the via 154. The first and second anode electrodes a1, a2 can be formed to have equal or different areas.

Accordingly, for example, when the second anode electrode a2 and the cathode electrode b short-circuit, a drive current from the second drive transistor 150 does not flow through the organic emission layer. Instead, the current flows directly to the cathode electrode b, with the result that light is not emitted from the portion of the organic emission layer corresponding to the short circuit. However, some light is still emitted because a drive current from the first drive transistor 140 still flows through another portion of the organic emission layer from the first anode electrode a1. In this example, an emission area of the unit pixel corresponding to the second anode electrode a2 does not emit light, but an area corresponding to the first anode electrode a1 continues to emit light. This results in emission of light at a reduced emission luminance. Yet, short circuiting in the unit pixel of the present invention does not result in a completely dark pixel. This causes a user to have difficulty in visually recognizing the deterioration of a pixel.

Figure 8:
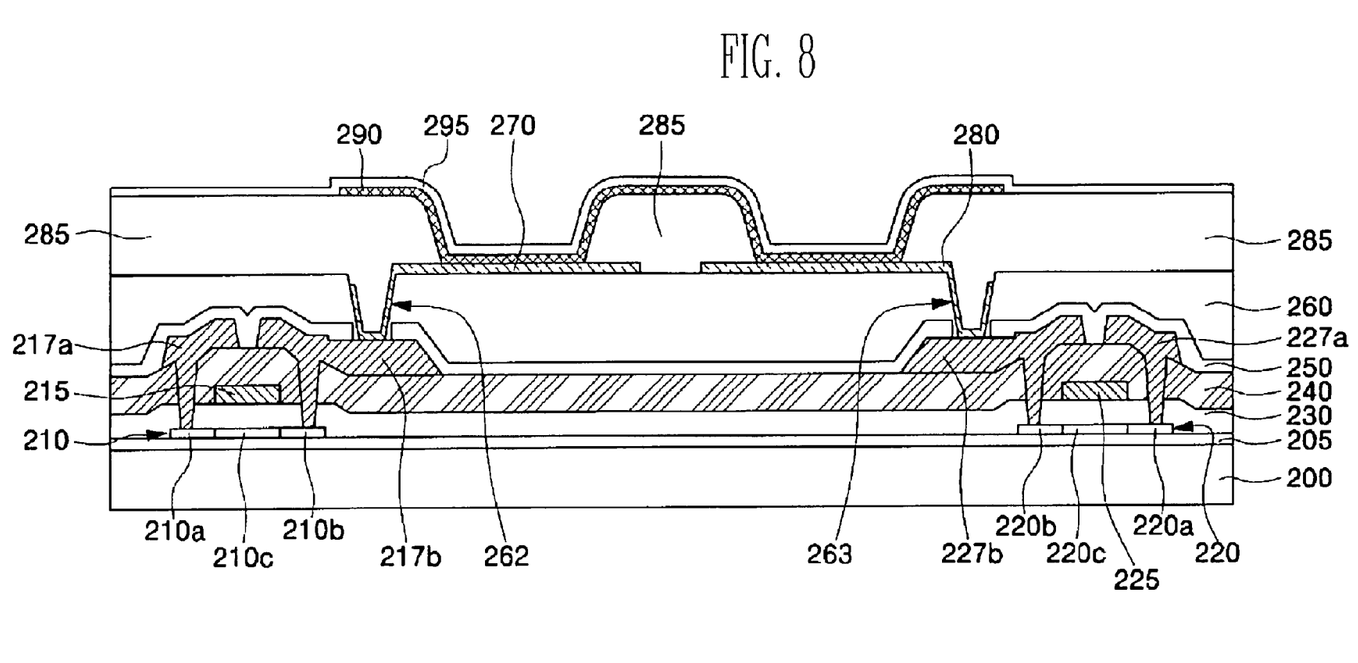
FIG. 8 is a cross-sectional view of the divided sub-pixel of FIG. 7 taken along a line I-I' according to an embodiment of the present invention.

FIG. 8 is a cross-sectional view of the sub-pixel of FIG. 7 taken along a line I-I'.

A buffer layer 205 may be formed on a substrate 200, and first and second semiconductor layers 210, 220 are formed over the buffer layer 205. The buffer layer 205 is not required. However, it can be formed to prevent introduction of impurities into the device from the substrate. The buffer layer 205 can be formed from silicon nitride ($SiN_x$) film, silicon oxide ($SiO_2$) film, or silicon nitrogen oxide ($SiO_xN_y$) film. The first semiconductor layer 210 is formed from amorphous or crystalline silicon film. The first semiconductor layer 210 includes a source region 210a, a drain region 210b, and a channel region 210c. The second semiconductor layer 220 is formed from amorphous or crystalline silicon film. The second semiconductor layer 220 includes a source contact region 220a, a drain contact region 220b, and a channel region 220c.

A gate insulation film 230 and gate electrodes 215, 225 are located over the substrate and above the first and second semiconductor layers 210, 220. An interlay insulating film 240 is formed over the resulting object. Further, source/drain electrodes 217a/217b, 227a/227b are formed above the interlay insulation film but going through the layers of interlay insulation film and the gate insulation film to contact the source/drain regions 210a/210b, 220a/220b of the first and second semiconductor layers 210, 220.

A passivation layer 250 is formed over the source/drain electrodes 217a/217b, 227a/227b in order to protect the lower layers from external moisture or impurities during an etching step of the manufacturing process. The passivation layer 250 is formed from a laminate film of $SiO_2$, $SiN_x$, or $SiO_2/SiN_x$.

A planarization layer 260 may be formed over the passivation layer 250. First and second anode electrodes 270 and 280 are located over the planarization layer 260. The first and second anode electrodes 270 and 280 can be formed from a transparent conductive material such as ITO or indium zinc oxide (IZO). However, the present invention is not limited to ITO and IZO anodes, and the anodes can be formed from a laminate film including a reflection film such as Al, Al alloy, Ag, or Ag alloy of high reflection rate, and a transparent conductive film such as ITO or IZO.

The first anode electrode 270 contacts the source or drain electrodes 217a, 217b, for example, the drain electrode 217b, through a via 262 formed through the passivation layer 250 and the planarization layer 260. The second anode electrode 280 contacts the source or drain electrodes 227a, 227b, for example, the drain electrode 227b, through a via 263 formed through the passivation layer 250 and the planarization layer 260.

A pixel defining layer (PDL) 285 is formed over the first and second anode electrodes 270 and 280. As shown, the PDL 285 is etched to have two pixel opening regions so that the first and second anode electrodes 270 and 280 are exposed.

An organic emission layer 290 is formed on the portions of the first and second anode electrodes 270 and 280 that are exposed in the two pixel opening regions. A common cathode electrode 295 is formed over the organic emission layer 290, so that an organic light emitting display device can be achieved.

In the organic light emitting display device of one embodiment of the present invention, if a short-circuit occurs between one of anode electrodes and a cathode electrode of a sub-pixel that is susceptible to short-circuiting, the sub-pixel does not emit light while another sub-pixel corresponding to another anode electrode may continue to emit light in a normal fashion. Accordingly, it becomes difficult to visually recognize and perceive the deterioration of the pixel due to the occurrence of the short-circuit in one of the pixel's sub-pixels.

A circuit for a divided sub-pixel including an organic light emitting diode having two drive transistors, two anode electrodes, and a common cathode electrode, which are formed at a sub-pixel having a relatively thin organic emission layer, was described with reference to FIG. 5 to FIG. 8. The relatively thin dimension of the organic emission layer in the sub-pixel may render the sub-pixel conducive to short circuiting due to fabrication flaws. Similarly, and according to the principles described above, a circuit including an organic light emitting diode having more than two drive transistors may be used for some of the sub-pixels of a pixel. This circuit that may include n drive transistors, n anode electrodes, and a common cathode electrode, falls within the system and methods described above.

Further, although the two drive transistors are shown as PMOS transistors in FIG. 7 and FIG. 8, they may be instead NMOS transistors as shown in FIG. 6. In this case, the organic light emitting diode OLED includes two cathode electrodes and a common anode electrode. The two cathode electrodes are connected to drains of the two NMOS transistors, and the anode electrode is connected to a power source of voltage ELVDD. Sources of the two NMOS transistors are connected to a reference voltage ELVSS in common.

Figure 9:
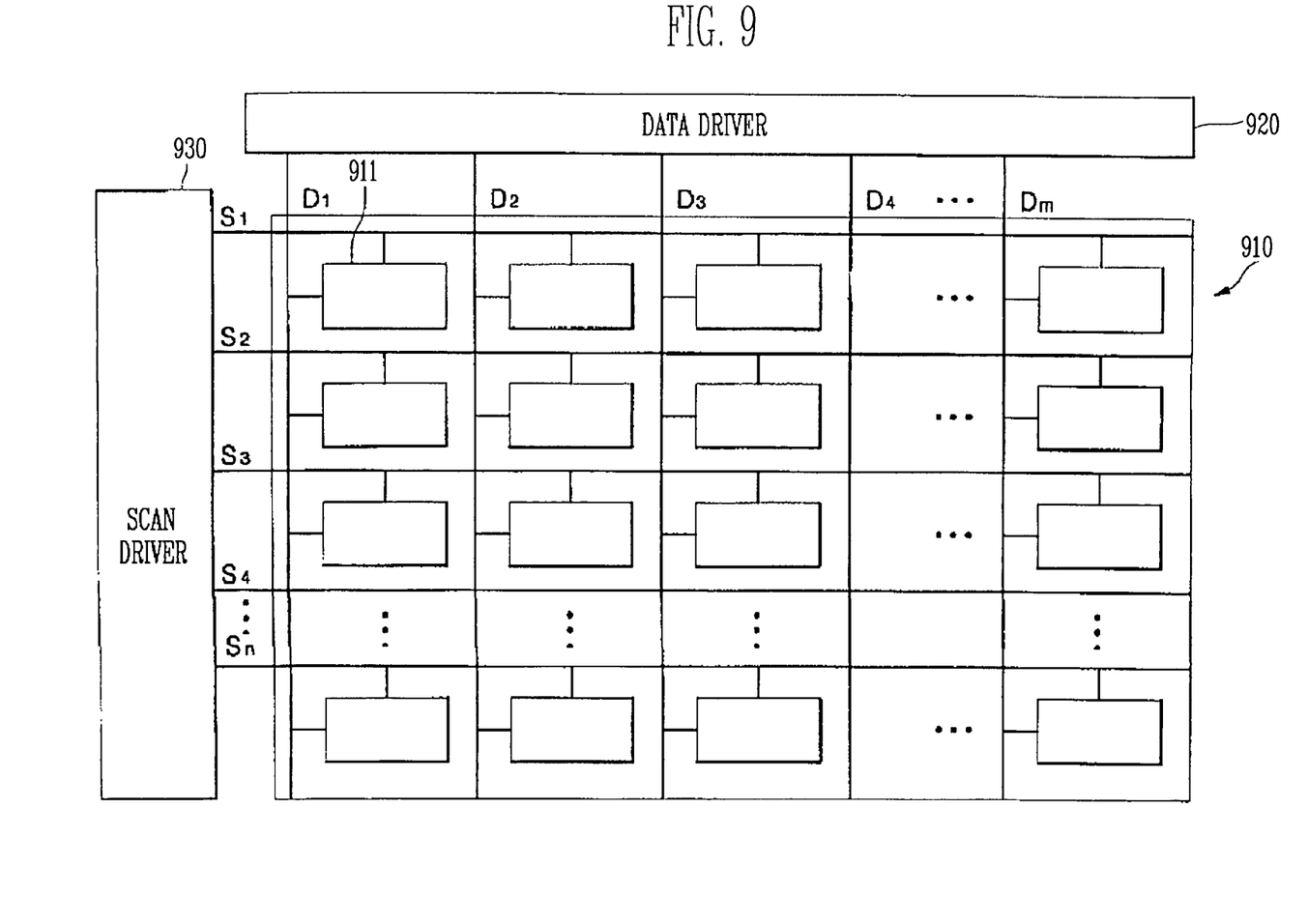
FIG. 9 is a block diagram showing an organic light emitting display device according to the embodiments of the present invention.

FIG. 9 is a block diagram showing an organic light emitting display device according to the embodiments of the present invention. The organic light emitting display device of the embodiments of the invention includes a display region 910, a data driver 920, and a scan driver 930. The display region 910 includes a plurality of data lines D1, D2, D3 . . . Dm, and a plurality of scan lines S1, S2, S3 . . . Sn, arranged to cross directions, and a plurality of pixels 911. The data lines D1, D2, D3 . . . Dm carry a data signal, and the scan lines S1, S2, S3 . . . Sn carry a scan signal. The pixels 911 are formed at intersections of the data lines D1, D2, D3 . . . Dm and the scan lines S1, S2, S3 . . . Sn. The data driver 920 outputs a data signal indicating an image signal through the data lines D1, D2, D3 . . . Dm. The scan driver 930 sequentially outputs a select signal through the scan lines S1, S2, S3 . . . Sn to drive the pixel 911. The pixels 911 may each include sub-pixels as described above. Each pixel 911 includes at least one divided sub-pixel.

Although certain exemplary embodiments of the present invention have been shown and described, it would be appreciated by those skilled in the art that changes might be made to these embodiments without departing from the principles and spirit of the invention, the scope of which is defined in the appended claims and their equivalents.

What is claimed is:

1. An organic light emitting display device comprising a data line, a scan line, and a plurality of pixels, each pixel having at least two sub-pixels, a divided sub-pixel of the at least two sub-pixels having an organic emission layer with a thickness smaller than that of an organic emission layer of any other sub-pixel of the at least two sub-pixels,
    wherein the divided sub-pixel includes at least two drive transistors,
    wherein a number of drive transistors included in any other sub-pixel of the at least two subpixels is less than that of the divided sub-pixel, and
    wherein the at least two sub-pixels are configured to be driven by the data line and the scan line.

2. The organic light emitting display device of claim 1,
    wherein the pixel includes a red sub-pixel, a green sub-pixel, and a blue sub-pixel, and
    wherein the blue sub-pixel is the divided sub-pixel.

3. The organic light emitting display device of claim 2,
    wherein the at least two drive transistors are electrically connected to each other,
    wherein each of the at least two drive transistors includes a gate electrode and a source electrode, and
    wherein gate electrodes of the at least two drive transistors are connected together and source electrodes of the at least two drive transistors are connected together.

4. An organic light emitting display device comprising a plurality of pixels formed at intersections of directions of a plurality of scan lines and directions of a plurality of data lines, each pixel having one or more sub-pixels, at least one of the sub-pixels being a divided sub-pixel, the divided sub-pixel including:
    at least two drive transistors being electrically connected to each other to have a common gate to source voltage, and being configured to receive a data signal through a corresponding one of the data lines; and
    an organic light emitting diode including at least two first electrodes, a second electrode, and an organic emission layer formed between the at least two first electrodes and the second electrode, each first electrode being configured to receive an electric current from a corresponding one of the at least two drive transistors,
    wherein each of the at least two first electrodes corresponds to a corresponding one of at least two light emitting areas of the organic light emitting diode, and the at least two light emitting areas are configured to emit light in substantially a same direction, and
    wherein a number of drive transistors included in any other sub-pixel of the one or more sub-pixels is less than that of the divided sub-pixel.

5. The organic light emitting display device of claim 4,
    wherein each pixel includes a red sub-pixel, a green sub-pixel, and a blue sub-pixel, and
    wherein the blue sub-pixel is the divided sub-pixel.

6. The organic light emitting display device of claim 4, wherein the drive transistors are PMOS transistors.

7. The organic light emitting display device of claim 6, wherein the second electrode of the organic light emitting diode is connected to a reference voltage.

8. The organic light emitting display device of claim 4, wherein the drive transistors are NMOS transistors.

9. The organic light emitting display device of claim 8, wherein the second electrode of the organic light emitting diode is connected to a power source.

10. The organic light emitting display device of claim 4, wherein the divided sub-pixel further includes a capacitor coupled to the drive transistors.

11. An organic light emitting display device comprising a plurality of pixels formed at intersections of directions of a plurality of scan lines and directions of a plurality of data lines, each pixel including sub-pixels, at least one of the sub-pixels being a divided sub-pixel, the divided sub-pixel including:
- a switching transistor having a gate connected to one of the scan lines and a source connected to one of the data lines;
- a capacitor having a first electrode connected to a drain of the switching transistor and a second electrode connected to a voltage source;
- at least two drive transistors connected together to have a common gate to source voltage, each drive transistor having a source connected to the voltage source, each drive transistor having a gate connected to the drain of the switching transistor; and
- an organic light emitting diode including first electrodes, a second electrode, and an organic emission layer formed between the first electrodes and the second electrode, the number of the first electrodes corresponding to the number of the at least two drive transistors, each first electrode being configured to receive an electric current from a corresponding one of the at least two drive transistors,
- wherein each of the first electrodes corresponds to a corresponding one of a plurality of light emitting areas of the organic light emitting diode, and the light emitting areas are configured to emit light in substantially a same direction, and
- wherein a number of drive transistors included in any other sub-pixel of the sub-pixels is less than that of the divided sub-pixel.

12. The organic light emitting device of claim 11, wherein a thickness of the organic emission layer of the organic light emitting diode of the divided sub-pixel is smaller than a thickness of an organic emission layer included in organic light emitting diodes of other sub-pixels.

13. The organic light emitting display device of claim 11, wherein each of the pixels includes a red sub-pixel, a green sub-pixel, and a blue sub-pixel, and
wherein the blue sub-pixel is the divided sub-pixel.

14. The organic light emitting display device of claim 13, wherein the second electrode of the organic light emitting diode is connected to a reference voltage.

15. The organic light emitting display device of claim 11, wherein the drive transistors are of the same conductivity type.

16. An organic light emitting display device comprising a plurality of pixels formed at intersections of a plurality of scan lines and a plurality of data lines, the data lines and the scan lines crossing over one another at the intersections, each pixel including a plurality of sub-pixels, the sub-pixels including at least one divided sub-pixel, one of the at least one divided sub-pixel comprising:
- a switching transistor having a gate connected to one of the scan lines and a source connected to one of the data lines;
- a capacitor having a first electrode connected to a drain of the switching transistor and a second electrode connected to a voltage source;
- at least two drive transistors connected together to share a common gate for sourcing voltage, a source of each drive transistor being connected to the voltage source, a gate of each drive transistor being connected to the drain of the switching transistor; and
- an organic light emitting diode including first electrodes, a second electrode, and organic emission layers formed between the first electrodes and the second electrode, the first electrodes each configured to receive an electric current corresponding to one of the drive transistors,
- wherein each of the first electrodes corresponds to a corresponding one of a plurality of light emitting areas of the organic light emitting diode, and the light emitting areas are configured to emit light in substantially a same direction, and
- wherein a number of drive transistors included in any other sub-pixel of the sub-pixels is less than that of the divided sub-pixel.

17. The organic light emitting display device of claim 16, wherein each of the pixels includes a red sub-pixel, a green sub-pixel, and a blue sub-pixel, and
wherein the blue sub-pixel is the divided sub-pixel.

18. The organic light emitting display device of claim 16, wherein the second electrode of the organic light emitting diode is connected to a reference voltage.

19. The organic light emitting display device of claim 16, wherein the drive transistors are of the same conductivity type.

20. The organic light emitting device of claim 16,
wherein a thickness of the organic emission layer of the organic light emitting diode of the divided sub-pixel is smaller than a thickness of an organic emission layer included in an organic light emitting diode of any other sub-pixel of the sub-pixels.

21. An organic light emitting display device comprising a data line, a scan line, and a plurality of pixels, each pixel having at least two sub-pixels,
- wherein at least one of the at least two sub-pixels is a divided sub-pixel and includes at least two drive transistors, the at least two sub-pixels are configured to be driven by the data line and the scan line,
- wherein the divided sub-pixel includes an organic emission layer having a thickness smaller than a thickness of an organic emission layer of a non-divided sub-pixel of the at least two sub-pixels, and
- wherein a number of drive transistors included in the non-divided sub-pixel is less than that of the divided sub-pixel.

22. The organic light emitting display device of claim 21, wherein the pixel includes a red sub-pixel, a green sub-pixel, and a blue sub-pixel, and
wherein the blue sub-pixel is the divided sub-pixel.

23. The organic light emitting display device of claim 22, wherein the at least two drive transistors included in the divided sub-pixel are electrically connected to each other,
wherein each of the at least two drive transistors includes a gate electrode and a source electrode, and
wherein the gate electrodes of the at least two drive transistors are connected together and the source electrodes of the at least two drive transistors are connected together.

* * * * *